(12) United States Patent
Park

(10) Patent No.: US 11,258,430 B2
(45) Date of Patent: Feb. 22, 2022

(54) APPARATUS AND METHOD FOR SELECTING FREQUENCY BAND

(71) Applicant: Samsung Electronics Co., Ltd., Suwon-si (KR)

(72) Inventor: Chang-Joon Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/000,954

(22) Filed: Aug. 24, 2020

(65) Prior Publication Data

US 2020/0389152 A1    Dec. 10, 2020

Related U.S. Application Data

(63) Continuation of application No. 16/524,566, filed on Jul. 29, 2019, now Pat. No. 10,756,705, which is a continuation of application No. 15/912,117, filed on Mar. 5, 2018, now Pat. No. 10,367,474, which is a continuation of application No. 13/890,545, filed on May 9, 2013, now Pat. No. 9,912,317.

(30) Foreign Application Priority Data

Sep. 3, 2012  (KR) .................... 10-2012-0097362

(51) Int. Cl.
*H03H 9/72* (2006.01)
*H04B 1/00* (2006.01)

(52) U.S. Cl.
CPC .............. *H03H 9/72* (2013.01); *H03H 9/725* (2013.01); *H04B 1/006* (2013.01)

(58) Field of Classification Search
CPC .......... H03H 9/72; H03H 9/725; H04B 1/006
USPC ........................... 333/133, 193–196; 455/82
See application file for complete search history.

(56) References Cited

U.S. PATENT DOCUMENTS

| 6,483,399 | B1 | 11/2002 | Atokawa |
| 7,692,513 | B2 | 4/2010 | Yoshimoto |
| 7,751,782 | B2 | 7/2010 | Weng |
| 2005/0117069 | A1 | 6/2005 | McNeely |
| 2006/0189286 | A1 | 8/2006 | Kyu et al. |
| 2012/0198693 | A1 | 8/2012 | Kim et al. |
| 2012/0202436 | A1 | 8/2012 | Megahed |

(Continued)

FOREIGN PATENT DOCUMENTS

| CN | 201976093 U | 9/2011 |
| JP | 2003-179463 A | 6/2003 |

(Continued)

OTHER PUBLICATIONS

Japanese Patent Office; Japanese Notification of Reason for Rejection; dated Nov. 12, 2018; Application No. 2017-226338; Japan.

(Continued)

*Primary Examiner* — Robert J Pascal
*Assistant Examiner* — Jorge L Salazar, Jr.
(74) *Attorney, Agent, or Firm* — Jefferson IP Law, LLP

(57) ABSTRACT

A switching circuit is provided. The switching circuit includes at least one Surface Acoustic Wave (SAW) filter, a Single-Pole n Throw (SPnT) switch connected to an input port of each of the at least one SAW filter, and a Dual-Pole n Throw (DPnT) switch connected to an output port of each of the at least one SAW filter.

10 Claims, 9 Drawing Sheets

(56) References Cited

U.S. PATENT DOCUMENTS

2012/0224514 A1\* 9/2012 Shibata ............... H04B 1/0057
370/277
2012/0313726 A1 12/2012 Ueda et al.
2013/0072253 A1 3/2013 Siomkos et al.

FOREIGN PATENT DOCUMENTS

| JP | 2004-166258 A | 6/2004 |
| JP | 2006-237711 A | 9/2006 |
| JP | 2010-154337 A | 7/2010 |
| JP | 2011-176746 A | 9/2011 |
| KR | 10-2004-0015382 A | 2/2004 |
| KR | 10-2004-0094832 A | 11/2004 |
| KR | 10-0539951 B1 | 12/2005 |
| KR | 10-2007-0110957 A | 11/2007 |
| KR | 10-2010-0075751 A | 7/2010 |

OTHER PUBLICATIONS

Machine English Translation of CN201976093 Published on Sep. 14, 2011 (Year: 2011).
Korean Office Action with English translation dated Mar. 14, 2019; Korean Appln. No. 10-2012-0097362.
Korean Office Action with English translation dated Oct. 7, 2019; Korean Appln. No. 10-2019-0070946.
Japanese Office Action with English translation dated Feb. 3, 2020; Japanese Appln. No. 2019-022905.

\* cited by examiner

APPARATUS AND METHOD FOR SELECTING FREQUENCY BAND

CROSS-REFERENCE TO RELATED APPLICATION(S)

This application is a continuation application of prior application Ser. No. 16/524,566, filed on Jul. 29, 2019, which is a continuation of prior application Ser. No. 15/912,117, filed on Mar. 5, 2018, which has issued as U.S. Pat. No. 10,367,474 on Jul. 30, 2019, which is a continuation of Ser. No. 13/890,545, filed on May 9, 2013, which has issued as U.S. Pat. No. 9,912,317 on Mar. 6, 2018 and was based on and claimed priority under 35 U.S.C. § 119(a) of a Korean patent application filed in the Korean Intellectual Property Office on Sep. 3, 2012 and assigned Serial No. 10-2012-0097362, the entire disclosure of each of which is hereby incorporated by reference.

BACKGROUND OF THE INVENTION

1. Field of the Invention

The present invention relates to an apparatus and method for selecting a frequency band.

2. Description of the Related Art

A radio communication system may provide various high-speed large-capacity services to Mobile Stations (MSs), and may be a Long-Term Evolution (LTE) mobile communication system, a Long-Term Evolution Advanced (LTE-A) mobile communication system, an Evolved Packet System (EPS), an Institute of Electrical and Electronics Engineers (IEEE) 802.16m communication system and any other suitable and/or similar radio communication system. As described above, radio communication systems have evolved, along with MSs that have evolved to receive high-speed large-capacity services, and more specially to receive services through various frequency bands.

FIG. 1 illustrates an internal structure of an MS in a radio communication system according to the related art.

Referring to FIG. 1, an MS includes an antenna (ANT) and a Front End Module (FEM) 100. The FEM 100 includes a switch, such as a Single-Pole 7 Throw (SP1T) switch 111 and a plurality of filters, such as Surface Acoustic Wave (SAW) filters which are shown as first through seventh SAW filters 113, 115, 117, 119, 121, 123 and 125. Each of the SAW filters 113 to 125 may be used for a Transmission (TX) jammer rejection, and may perform a filtering operation corresponding to a preset frequency band. The SAW filters 113 to 125 have paths connected to a Radio Frequency Integrated Circuit (RFIC) (not shown) per a related frequency band.

Signals output from the SAW filters 113 to 125 may be integrated so that an MS facilitates receiving services through various frequency bands. Further, a case of integrating the signals output from the SAW filters 113 to 125 may occur in order to decrease the unit cost of production of the MS and to minimize a hardware space or size of the MS. If the signals output from the SAW filters 113 to 125 are integrated, then the unit cost of production of the MS may be decreased and the hardware space of the MS may be minimized since the paths on which the SAW filters 113 to 125 and the RFIC are connected one to one. However, FEMs of the related art may not integrate signals output from SAW filters.

Therefore, a need exists for a system and method for integrating the signals output from the SAW filters.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide a switching circuit and method for selecting a frequency band.

Another aspect of an exemplary embodiment of the present invention is to provide a Radio Frequency (RF) hardware and method for selecting a frequency band.

Furthermore, another aspect of an exemplary embodiment of the present invention is to provide a Front End Module (FEM) and method for selecting a frequency band.

Still another aspect of an exemplary embodiment of the present invention is to provide a signal reception apparatus and method for selecting a frequency band.

Still another aspect of an exemplary embodiment of the present invention is to provide at least one of a switching circuit, an RF hardware, a FEM, and a signal reception apparatus and method for selecting a frequency band by combining output signal from filters.

Still another aspect of an exemplary embodiment of the present invention is to provide a switching circuit, an RF hardware, a FEM, and a signal reception apparatus and method for selecting a frequency band by combining output signal from filters thereby satisfying a threshold frequency band attenuation requirement value.

Still another aspect of an exemplary embodiment of the present invention is to provide at least one of a switching circuit, an RF hardware, a FEM, and a signal reception apparatus and method for selecting a frequency band by combining output signal from filters thereby satisfying a threshold isolation requirement value.

In accordance with one aspect of the present invention, a switching circuit for selecting a frequency band is provided. The switching circuit includes at least one Surface Acoustic Wave (SAW) filter, a Single-Pole n Throw (SPnT) switch connected to an input port of each of the at least one SAW filters, and a Dual-Pole n Throw (DPnT) switch connected to an output port of each of the at least one SAW filter.

In accordance with another aspect of the present invention, a switching circuit for selecting a frequency band is provided. The switching circuit includes a plurality of SAW filters,; a SPnT switch connected to an input port of each of the a plurality of SAW filters,; a first DPnT switch connected to an output port of at least one of the a plurality of SAW filters, and a second DPnT switch connected to an output port of at least one of the a plurality of SAW filters except for the at least one SAW filter connected to the first DPnT switch from among the a plurality of SAW filters.

In accordance with further another aspect of the present invention, a switching circuit for selecting a frequency band is provided. The switching circuit includes a plurality of SAW filters, a first SPnT switch connected to an input port of each of the a plurality of SAW filters, a second SPnT switch connected to an output port of at least one of the a plurality of SAW filters, and a third SPnT switch connected to an output port of at least one of the a plurality of SAW filters except for the at least one SAW filter connected to the second SPnT switch from among the a plurality of SAW filters.

In accordance with still another aspect of the present invention, a switching circuit for selecting a frequency band is provided. The switching circuit includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and input port of the second SPnT switch; and a combiner connected to an output port of each of the plurality of SAW filters.

In accordance with still another aspect of the present invention, a switching circuit for selecting a frequency band is provided. The switching circuit includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and an input port of the second SPnT switch, a first combiner connected to an output port of at least one of the plurality of SAW filters, and a second combiner connected to an output port of at least one of the plurality of SAW filters except for the at least one SAW filter connected to the first combiner from among the plurality of SAW filters.

In accordance with still another aspect of the present invention, a switching circuit for selecting a frequency band is provided. The switching circuit includes a plurality of SAW filters, a first SPnT switch connected to an input port of each of the plurality of SAW filters, and a second SPnT switch connected to an output port of each of the plurality of SAW filters.

In accordance with still another aspect of the present invention, an RF hardware for selecting a frequency band is provided. The RF hardware includes a plurality of SAW filters, a SPnT switch connected to an input port of each of the plurality of SAW filters, and a DPnT switch connected to an output port of each of the plurality of SAW filters.

In accordance with still another aspect of the present invention, an RF hardware for selecting a frequency band is provided. The RF hardware includes a plurality of SAW filters, a SPnT switch connected to an input port of each of the plurality of SAW filters, a first DPnT switch connected to an output port of at least one of the plurality of SAW filters, and a second DPnT switch connected to an output port of at least one of the plurality of SAW filters except for the at least one SAW filter connected to the first DPnT switch from among the plurality of SAW filters.

In accordance with still another aspect of the present invention, a RF hardware for selecting a frequency band is provided. The RF hardware includes a plurality of SAW filters, a SPnT switch connected to an input port of each of the plurality of SAW filters, a second SPnT switch connected to an output port of at least one of the plurality of SAW filters, and a third SPnT switch connected to an output port of at least one of the plurality of SAW filters except for the at least one SAW filter connected to the second SPnT switch from among the plurality of SAW filters.

In accordance with still another aspect of the present invention, an RF hardware for selecting a frequency band is provided. The RF hardware includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and input port of the second SPnT switch, and a combiner connected to an output port of each of the plurality of SAW filters.

In accordance with still another aspect of the present invention, an RF hardware for selecting a frequency band is provided. The RF hardware includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and an input port of the second SPnT switch, a first combiner connected to an output port of at least one of the plurality of SAW filters, and a second combiner connected to an output port of at least one of the plurality of SAW filters except for the at least one SAW filter connected to the first combiner from among the plurality of SAW filters.

In accordance with still another aspect of the present invention, an RF hardware for selecting a frequency band is provided. The RF hardware includes a plurality of SAW filters, a first SPnT switch connected to an input port of each of the plurality of SAW filters, and a second SPnT switch connected to an output port of each of the plurality of SAW filters.

In accordance with still another aspect of the present invention, an FEM for selecting a frequency band is provided. The FEM includes a plurality of SAW filters, a SPnT switch connected to an input port of each of the plurality of SAW filters, and a DPnT switch connected to an output port of each of the plurality of SAW filters.

In accordance with still another aspect of the present invention, an FEM for selecting a frequency band is provided. The FEM includes a plurality of SAW filters, a SPnT switch connected to an input port of each of the plurality of SAW filters, a DPnT switch connected to an output port of at least one of the plurality of SAW filters, and a second DPnT switch connected to an output port of at least one of the plurality of SAW filters except for the at least one SAW filter connected to the first DPnT switch from among the plurality of SAW filters.

In accordance with still another aspect of the present invention, an FEM for selecting a frequency band is provided. The FEM includes a plurality of SAW filters, a first SPnT switch connected to an input port of each of the plurality of SAW filters, a second SPnT switch connected to an output port of at least one of the plurality of SAW filters, and a third SPnT switch connected to an output port of at least one of the plurality of SAW filters except for the at least one SAW filter connected to the second SPnT switch from among the plurality of SAW filters.

In accordance with still another aspect of the present invention, an FEM for selecting a frequency band is provided. The FEM includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and input port of the second SPnT switch; and a combiner connected to an output port of each of the plurality of SAW filters.

In accordance with still another aspect of the present invention, an FEM for selecting a frequency band is provided. The FEM includes a plurality of SAW filters, a first SPnT switch connected to an input port of at least one of the plurality of SAW filters, a second SPnT switch connected to an input port of at least one of the plurality of SAW filters except for the at least one SAW filter connected to the first SPnT switch from among the plurality of SAW filters, a SPDT switch connected to an input port of the first SPnT switch and an input port of the second SPnT switch, a first combiner connected to an output port of at least one of the plurality of SAW filters, and a second combiner connected to an output port of at least one of the plurality of SAW filters except for the at least one SAW filter connected to the first combiner from among the plurality of SAW filters.

In accordance with still another aspect of the present invention, an FEM for selecting a frequency band is provided. The FEM includes a plurality of SAW filters, a first SPnT switch connected to an input port of each of the plurality of SAW filters, and a second SPnT switch connected to an output port of each of the plurality of SAW filters.

In accordance with still another aspect of the present invention, a signal reception apparatus for selecting a frequency band is provided. The signal reception apparatus includes a switching circuit, including a plurality of SAW filters, for integrating at least one of signals output from the plurality of SAW filters based on a frequency band selection signal and outputting the integrated signal, and a controller for generating the frequency band selection signal which control the switching circuit to integrate at least one of signals output from the plurality of SAW filters based on a frequency band to be used in the signal reception apparatus and output the integrated signal.

In accordance with still another aspect of the present invention, a method for selecting a frequency band in a signal reception apparatus is provided. The method includes generating a frequency band selection signal indicating a frequency band to be selected if a frequency band selection is necessary, and integrating at least one of signals output from a plurality of SAW filters included in a switching circuit based on the frequency band selection signal and outputting the integrated signal.

In accordance with still another aspect of the present invention, a method for selecting a frequency band in a switching circuit is provided. The method includes integrating at least one of signals output from a plurality of SAW filters included in a switching circuit based on a frequency band selection signal and outputting the integrated signal.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, it should be noted that like reference numbers are used to depict the same or similar elements, features, and structures.

DETAILED DESCRIPTION OF EXEMPLARY EMBODIMENTS

Figure 1:
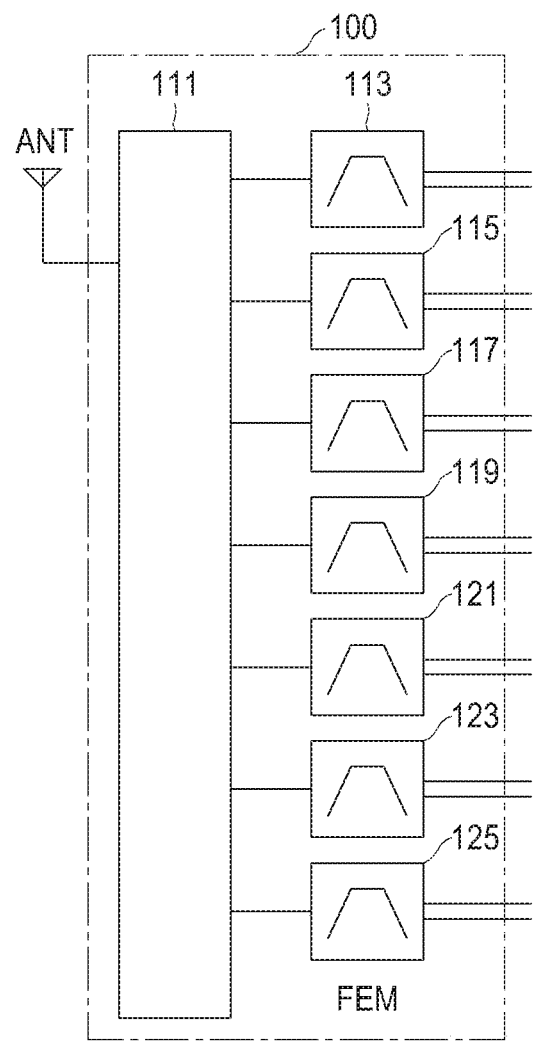
FIG. 1 illustrates an internal structure of an MS in a radio communication system according to the related art.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Exemplary embodiments of the present invention may include a switching circuit and a method for selecting a frequency band. Exemplary embodiments of the present invention may also include Radio Frequency (RF) hardware and method for selecting a frequency band. Furthermore, exemplary embodiments of the present invention include a Front End Module (FEM) and method for selecting a frequency band. Exemplary embodiments of the present invention may also include a signal reception apparatus and method for selecting a frequency band. Exemplary embodiments of the present invention may include a switching circuit/RF hardware/FEM/signal reception apparatus and method for selecting a frequency band by combining output signals from filters. Exemplary embodiments of the present invention may also include a switching circuit/RF hardware/FEM/signal reception apparatus and method for selecting a frequency band by combining output signal from filters thereby satisfying a threshold frequency band attenuation requirement value. Exemplary embodiments of the present invention may further include a switching circuit/RF hardware/FEM/signal reception apparatus and method for selecting a frequency band by combining output signal from filters thereby satisfying a threshold isolation requirement value.

Exemplary embodiments of the present invention will be described below with reference to the FEM. However, it will be understood by those of ordinary skill in the art that the switching circuit, the RF hardware, and the signal reception apparatus as well as the FEM may select a frequency band in the same manner used in the FEM.

Exemplary embodiments of the present invention will be described below with reference to the filter, which may be a Surface Acoustic Wave (SAW) filter. However, it will be understood by those of ordinary skill in the art that the filter may be any one of other filters that are similar and/or suitable, as well as the SAW filter.

Furthermore, in exemplary embodiments of the present invention, it may be assumed that a frequency band selection operation for each of the FEM, the switching circuit and the RF hardware may be described based on a signal reception apparatus. However, it will be understood by those of ordinary skill in the art that the frequency band selection operation for each of the FEM, the switching circuit and the RF hardware may be applied in a signal transmission apparatus.

Exemplary embodiments of the present invention will be described below with reference to the radio communication system, such as a Long-Term Evolution (LTE) mobile communication system. However, the radio communication system may be any one of a Long-Term Evolution Advanced (LTE-A) mobile communication system, an Evolved Packet System (EPS) and an Institute of Electrical and Electronics Engineers (IEEE) 802.16m mobile communication system or any other similar and/or suitable mobile communication system. Furthermore, in exemplary embodiments of the present invention, it is assumed that a signal reception apparatus may be implemented in a Mobile Station (MS). However, the present invention is not limited thereto, and the signal reception apparatus may be any suitable electronic device.

Figure 2:
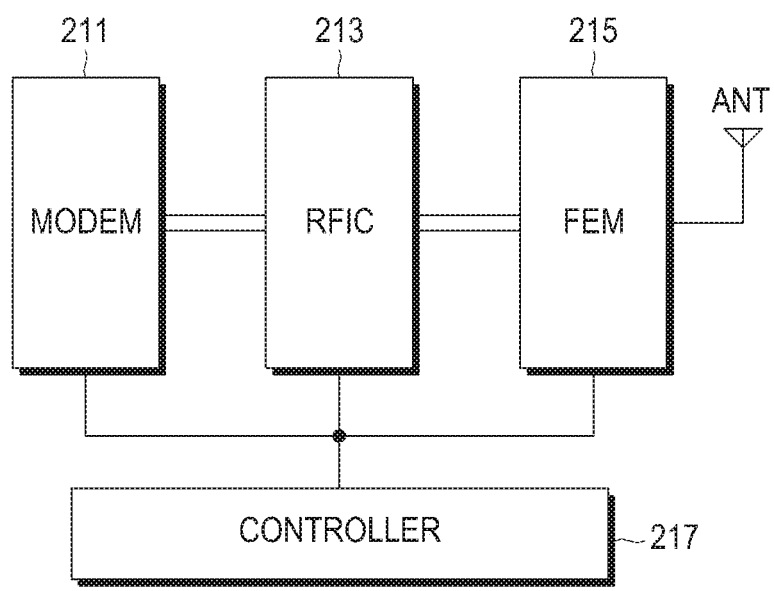
FIG. 2 illustrates an internal structure of a signal reception apparatus in a radio communication system according to an exemplary embodiment of the present invention.

FIG. 2 illustrates an internal structure of a signal reception apparatus in a radio communication system according to an exemplary embodiment of the present invention.

Referring to FIG. 2, the signal reception apparatus includes a Modulator/Demodulator (MODEM) 211, a Radio Frequency Integrated Circuit (RFIC) 213, an FEM 215, a controller 217, and an antenna ANT. The controller 217 may control the overall operation of the signal reception apparatus, and may control the signal reception apparatus so as to perform an operation of combining output signals from SAW filters included in the FEM 215. That is, the controller 217 may perform an operation of combining output signals from SAW filters included in the FEM 215 based on a frequency band to be used.

The MODEM 211 may modulate a signal to be transmitted to a signal transmission apparatus using a preset modulation scheme, such as a Phase Shift Keying scheme, a 16 Quadrature Amplitude Modulation (QAM) scheme, a 64 QAM scheme, or any other similar and/or suitable modulation scheme, and may output the modulated signal to the RFIC 213 under a control of the controller 217. The MODEM 211 may demodulate a signal received from the signal transmission apparatus using a demodulation scheme corresponding to a modulation scheme used in the signal transmission apparatus, and may output the demodulated signal to the RFIC 213 under a control of the controller 217.

The RFIC 213 may convert a signal output from the MODEM 211 into an RF signal and may output the RF signal to the FEM 215, or may convert a signal output from the FEM 215 into a baseband signal and may output the baseband signal to the MODEM 211 under a control of the controller 217. The FEM 215 may perform a filtering operation on a signal output from the RFIC 213 and may transmit the filtered signal to a signal reception apparatus through an antenna ANT, or may perform a filtering operation on a signal received through the antenna ANT and output the filtered signal to the RFIC 213 under a control of the controller 217. The FEM 215 may be implemented in various types, for example, a type including a switch and SAW filters, and a type including the switch, a combiner, and the SAW filters, or any other suitable and/or similar types, and the various types will be described below.

While the MODEM 211, the RFIC 213, the FEM 215, the controller 217 and the antenna ANT are shown in FIG. 2 as separate units, it is to be understood that this is for merely convenience of description. In other words, the MODEM 211, the RFIC 213, the FEM 215, the controller 217 and the antenna ANT may be incorporated into a single unit. An internal structure of an FEM 215 shown in FIG. 2 will be described with reference to FIGS. 3 to 8. That is, the FEM 215 shown in FIG. 2 may be implemented as one of exemplary embodiments shown in FIGS. 3 to 8.

Figure 3:
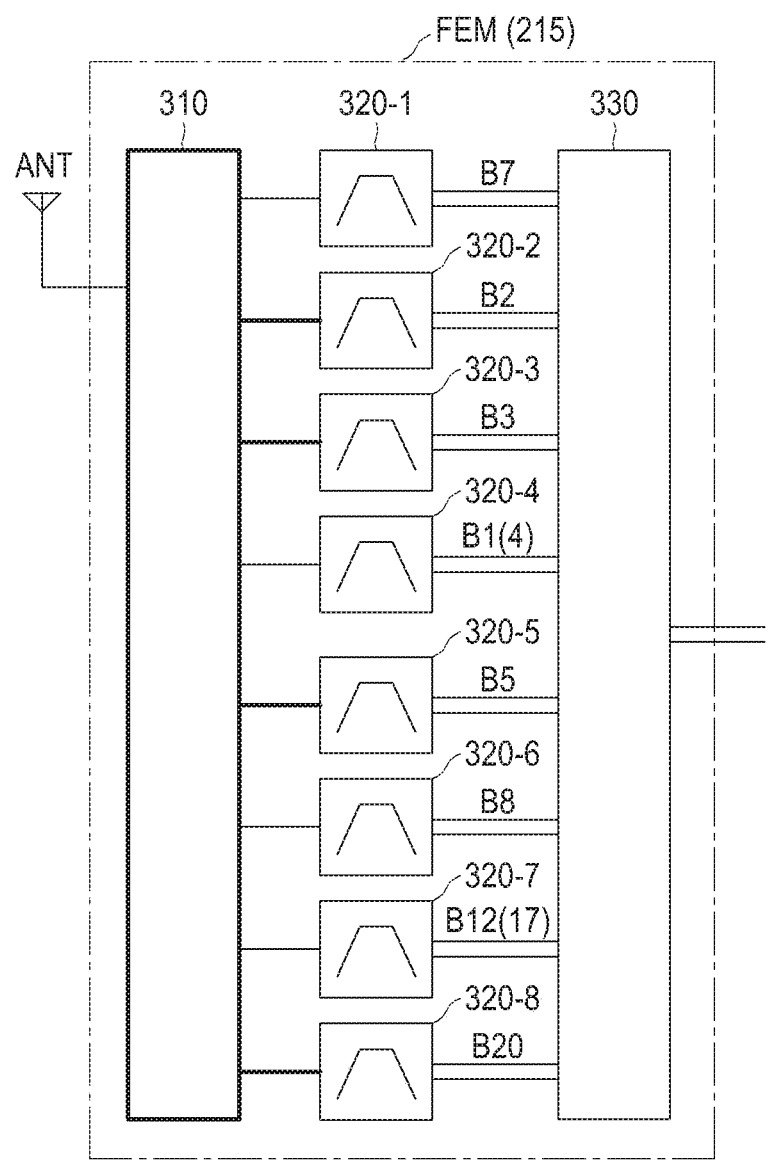
FIG. 3 illustrates an example of an internal structure of a Front End Module (FEM), such as the FEM 215 shown in FIG. 2, according to an exemplary embodiment of the present invention.

FIG. 3 illustrates an example of an internal structure of an FEM, such as the FEM 215 shown in FIG. 2, according to an exemplary embodiment of the present invention.

Referring to FIG. 3, the FEM 215 includes a Single-Pole 8 Throw (SP8T) switch 310, 8 SAW filters, such as SAW filters 320-1 through 320-8, and a Dual-Pole 16 Throw (DP16T) switch 330. The number of output ports of the FEM 215 is 1. An index mapped to an output port of each SAW filter denotes a frequency band index of a frequency band used in a related SAW filter, and the detailed description of the frequency band index will be omitted.

A threshold frequency band attenuation requirement value and a threshold isolation requirement value used in the signal reception apparatus should be satisfied after the signals output from the 8 SAW filters are integrated in order to integrate the signals output from the 8 SAW filters. In the present exemplary embodiments, it may be assumed that each of the threshold frequency band attenuation requirement value and the threshold isolation requirement value is 40 [dB]. However, the present invention is not limited thereto, and the threshold frequency band attenuation requirement value and the threshold isolation requirement value may be any suitable and/or similar value.

An isolation of a Single-Pole n-Throw (SPnT) switch affects an attenuation characteristic if signals output from SAW filters are simply integrated, and accordingly, the threshold frequency band attenuation requirement value and the threshold isolation requirement value may not be satisfied. Thus, a structure of an FEM implemented so as to include an SPnT switch and a Dual-Pole n-Throw (DPnT) switch are connected to the front and the rear of SAW filters in order to satisfy a threshold frequency band attenuation requirement value and a threshold isolation requirement value is illustrated in FIG. 3. That is, each of the SAW filters 320-1 to 320-8 may be connected to the SP8T switch 310 and the DP16T switch 330. Thus, signals output from the SAW filters 320-1 to 320-8 may be integrated through the DP16T switch 330 in a predetermined format for the signal reception apparatus. Here, the predetermined format may be determined under a control of the controller 217 or according to any suitable and/or similar manner.

The DP16T switch 330 may be used because the signals output from the SAW filters 320-1 to 320-8 are balance signals. However, it will be understood by those of ordinary skill in the art that the DP16T switch 330 may be an SPnT switch in a case where the signals output from the SAW filters 320-1 to 320-8 are single signals, and will be described below with reference to FIG. 8. So, it is possible that the FEM 215 may be in a form in which the threshold frequency band attenuation requirement value and the threshold isolation requirement value are satisfied because an isolation characteristic is acquired in the front and the rear of SAW filters if the FEM 215 is implemented as described with reference to FIG. 3.

Figure 4:
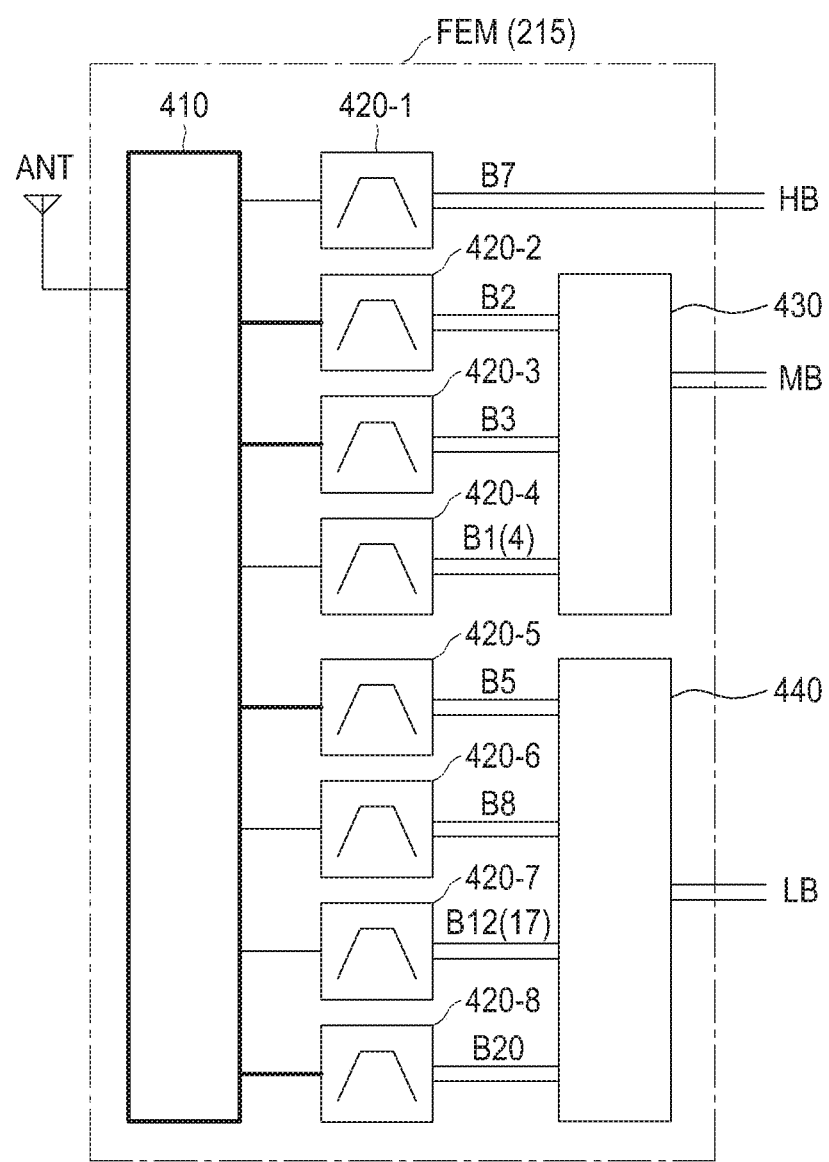
FIG. 4 illustrates another example of an internal structure of an FEM, such as the FEM 215 shown in FIG. 2, according to an exemplary embodiment of the present invention.

FIG. 4 illustrates another example of an internal structure of an FEM, such as the FEM 215 shown in FIG. 2, according to an exemplary embodiment of the present invention.

Referring to FIG. 4, the FEM 215 includes an SP8T switch 410, 8 SAW filters including SAW filters 420-1 to 420-8, a DP6T switch 430, and a DP6T switch 440. An index mapped to an output port of each SAW filter denotes a frequency band index of a frequency band used in a related SAW filter, and the detailed description of the frequency band index will be omitted.

As described with reference FIG. 3, the FEM 215 in FIG. 4 may be also implemented as a type in which an SPnT switch and a DPnT switch are connected to the front and the rear of the SAW filters in order to satisfy a threshold frequency band attenuation requirement value and a threshold isolation requirement value. That is, the SAW filters 420-2, 420-3 and 420-4 may be connected to the SP8T switch 410 and the DP6T switch 430, and signals output from the SAW filters 420-2, 420-3 and 420-4 may be integrated through the DP6T switch 430 in a predetermined format for the signal reception apparatus. The predetermined format may be determined under a control of the controller 217 or according to any suitable manner. That is, the SAW filters 420-5, 420-6, 420-7 and 420-8 may be connected to the SP8T switch 410 and the DP8T switch 440, and signals output from the SAW filters 420-5, 420-6, 420-7 and 420-8 may be integrated through the DP8T switch 440 in a predetermined format for the signal reception apparatus. Here, the predetermined format may be determined under a control of the controller 217 or according to any suitable manner. A signal output from the SAW filter 420-1 is output as it is, and thus, may be not output through a DPnT switch.

The signal output from the SAW filter 420-1 may be a High frequency Band (HB) signal, a signal output from the DP6T switch 430 may be a Middle frequency Band (MB) signal, and a signal output from the DP8T switch 440 may be a Low frequency Band (LB) signal. That is, the FEM 215, as illustrated in FIG. 4, includes three output ports, i.e., an LB port, an MB port, and an HB port. The LB denotes a frequency band lower than a first threshold frequency band, the MB denotes a frequency band equal to or greater than the first threshold frequency band and lower than a second threshold frequency band, and the HB denotes a frequency band equal to or greater than the second threshold frequency band.

The DP6T switch 430 and the DP8T switch 440 may be used because the signals output from the SAW filters 420-1 to 420-8 are balance signals. However, it will be understood by those of ordinary skill in the art that each of the DP6T switch 430 and the DP8T switch 440 may be an SPnT switch in a case where the signals output from the SAW filters 420-1 to 420-8 are single signals, and will be described below with reference to FIG. 7. As described above, the FEM 215 may be in a form in which the threshold frequency band attenuation requirement value and the threshold isolation requirement value are satisfied because an isolation characteristic may be acquired in the front and the rear of SAW filters if the FEM 215 is implemented as described in FIG. 4.

Figure 5:
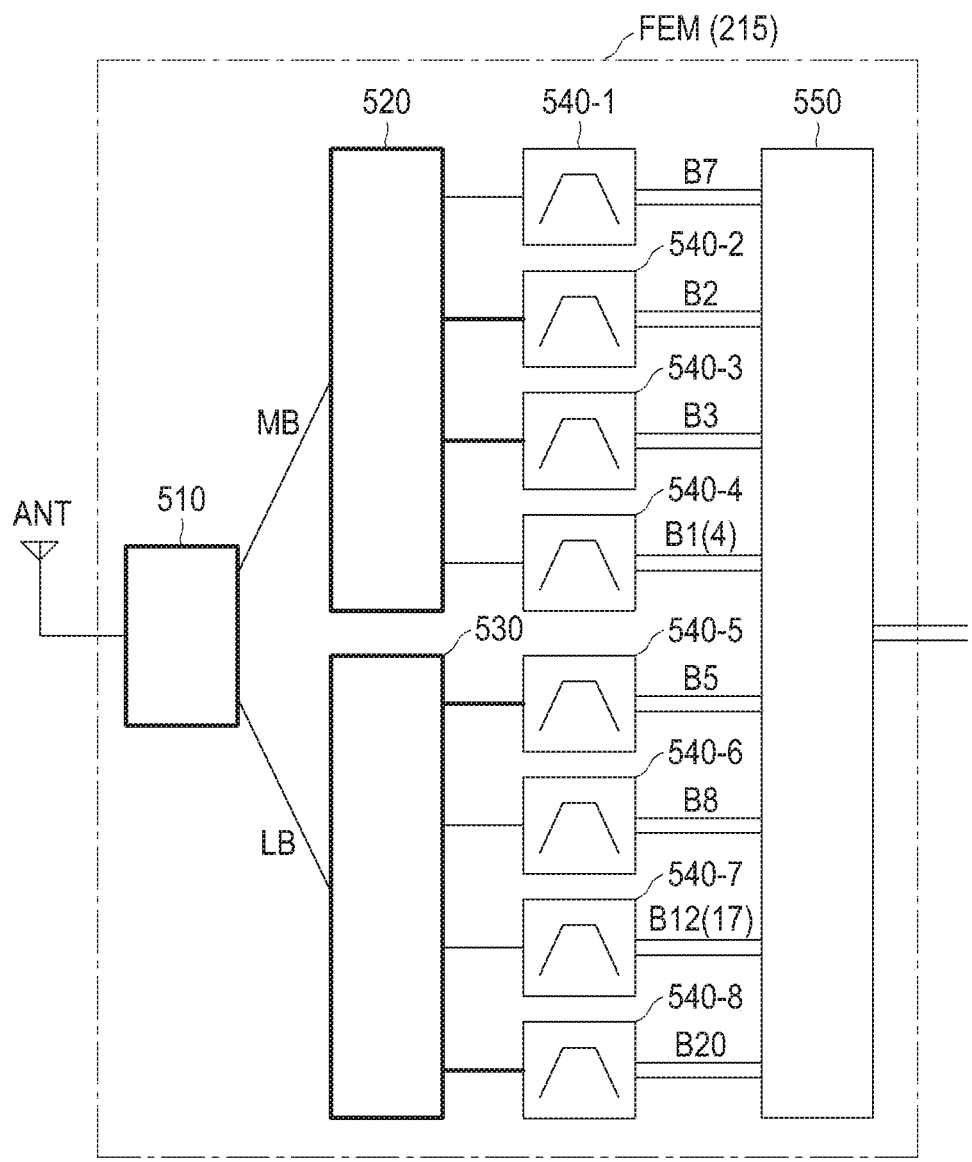
FIG. 5 illustrates further another example of an internal structure of an FEM, such as the FEM 215 shown in FIG. 2, according to an exemplary embodiment of the present invention.

FIG. 5 illustrates further another example of an internal structure of an FEM, such as the FEM 215 shown in FIG. 2, according to an exemplary embodiment of the present invention.

Referring to FIG. 5, the FEM 215 may include a Single-Pole Double Throw (SPDT) switch 510, an SP4T switch 520, an SP4T switch 530, 8 SAW filters including SAW filters 540-1 to 540-8, and a combiner 550. As shown in FIG. 5, the number of output ports of the FEM 215 is 1. An index mapped to an output port of each SAW filter denotes a frequency band index of a frequency band used in a related SAW filter, and the detailed description of the frequency band index will be omitted.

Unlike the exemplary embodiments of FIGS. 3 to 4, the FEM 215 in FIG. 5 may be implemented as a type in which an SPDT switch, which may acquire a relatively high isolation, and an SPnT switch are connected to the front of SAW filters in order to satisfy a threshold frequency band attenuation requirement value and a threshold isolation requirement value. The SPDT switch has a relatively low Insertion Loss (IL). Meanwhile, the SP4T switch may acquire relatively high isolation from among SPnT switches that are known to be used in radio communication systems, and the SPDT switch may be used in the exemplary embodiment of FIG. 5 since the SP4T switch only supports 4 ports.

Thus, the SAW filters 540-1, 540-2, 540-3 and 540-4 may be connected to the SP4T switch 520 and the combiner 550, and signals output from the SAW filters 540-1, 540-2, 540-3 and 540-4 may be integrated through the combiner 550 in a predetermined format for the signal reception apparatus. The predetermined format may be determined under a control of the controller 217 or according to any suitable manner.

The SAW filters 540-5, 540-6, 540-7, and 540-8 may be connected to the SP4T switch 530 and the combiner 550, and signals output from the SAW filter 540-5, 540-6, 540-7, and 540-8 may be integrated through the combiner 550 in a predetermined format for the signal reception apparatus. The predetermined format may be determined under a control of the controller 217 or according to any suitable manner. Accordingly, the FEM 215 may be implemented such that the threshold frequency band attenuation requirement value and the threshold isolation requirement value are satisfied because an isolation characteristic is acquired in the front of SAW filters if the FEM 215 is implemented as described in FIG. 5.

Figure 6:
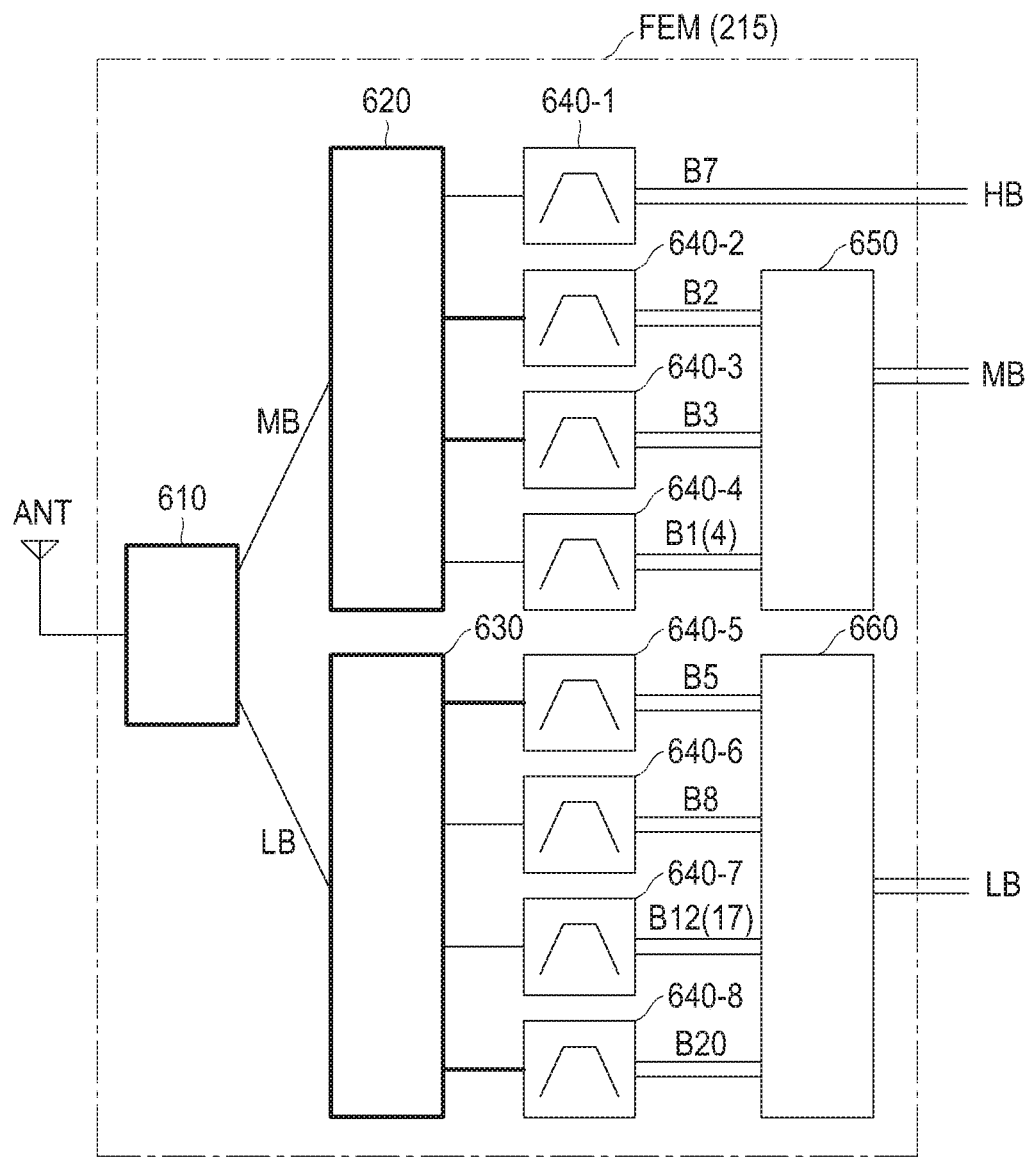
FIG. 6 illustrates still another example of an internal structure of an FEM, such as the FEM 215 shown in FIG. 2, according to an exemplary embodiment of the present invention.

FIG. 6 illustrates still another example of an internal structure of an FEM, such as the FEM 215 shown in FIG. 2, according to an exemplary embodiment of the present invention.

Referring to FIG. 6, the FEM 215 may include an SPDT switch 610, an SP4T switch 620, an SP4T switch 630, 8 SAW filters including SAW filters 640-1 to 640-8, a combiner 650 and a combiner 660. An index mapped to an output port of each SAW filter denotes a frequency band index of a frequency band used in a related SAW filter, and the detailed description of the frequency band index will be omitted. As described in FIG. 5, the FEM 215 in FIG. 6 may be a type in which an SPDT switch, which may acquire a relatively high isolation, and an SPnT switch are connected to the front of SAW filters in order to satisfy a threshold frequency band attenuation requirement value and a threshold isolation requirement value.

Accordingly, the SAW filters 640-2, 640-3, and 640-4 may be connected to the SP4T switch 620 and the combiner 650, and signals output from the SAW filter 640-2, the SAW filter 640-3 and the SAW filter 640-4 may be integrated through the combiner 650 in a predetermined format for the signal reception apparatus. The predetermined format may be determined under a control of the controller 217 or according to any suitable manner. The SAW filters 640-5, 640-6, 640-7, and 640-8 may be connected to the SP4T switch 630, and signals output from the SAW filters 640-5, 640-6, 640-7, and 640-8 may be integrated through the combiner 660 in a predetermined format for the signal reception apparatus. The predetermined format may be determined under a control of the controller 217 or according to any suitable manner.

A signal output from the SAW filter 640-1 may be output as it is rather than being output through a combiner. The signal output from the SAW filter 640-1 may be output as an HB signal, a signal output from the combiner 650 may be output as an MB signal, and a signal output from the combiner 660 may be output as an LB signal. That is, the FEM 215 according to the exemplary embodiment of FIG. 6 includes 3 output ports, i.e., an LB port, an MB port, and an HB port. Accordingly, the FEM 215 may be a form in which the threshold frequency band attenuation requirement value and the threshold isolation requirement value are satisfied because an isolation characteristic is acquired in the front of SAW filters if the FEM 215 is implemented as described in FIG. 6.

Figure 7:
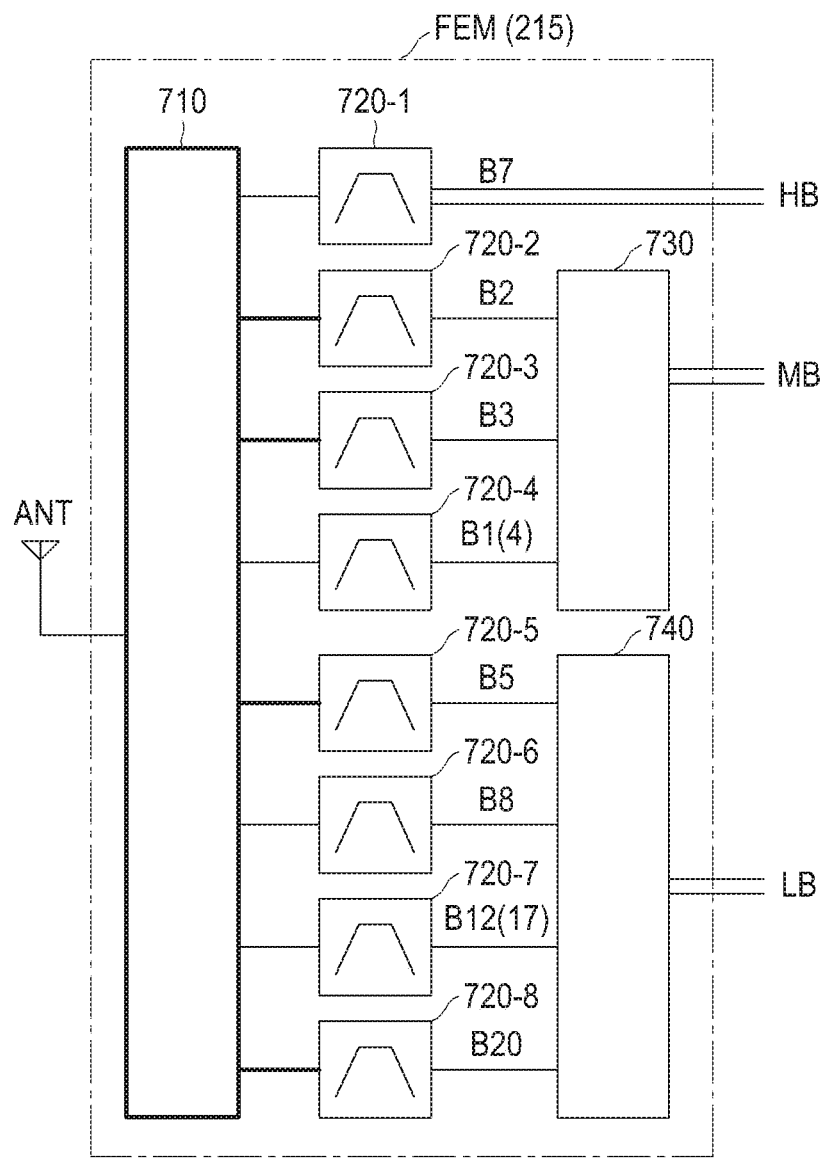
FIG. 7 illustrates still another example of an internal structure of an FEM, such as the FEM 215 shown in FIG. 2, according to an exemplary embodiment of the present invention.

FIG. 7 illustrates still another example of an internal structure of an FEM, such as the FEM 215 shown in FIG. 2, according to an exemplary embodiment of the present invention.

Referring to FIG. 7, the FEM 215 includes an SP8T switch 710, 8 SAW filters including SAW filters 720-1 to 720-8, an SP4T switch 730 and an SP4T switch 740. An index mapped to an output port of each SAW filter denotes a frequency band index of a frequency band used in a related SAW filter, and the detailed description of the frequency band index will be omitted.

The FEM 215 according to the exemplary embodiment of FIG. 7 may be implemented as a type in which a SPnT switch is connected to the front and the rear of SAW filters in order to satisfy a threshold frequency band attenuation requirement value and a threshold isolation requirement value. That is, the SAW filters 720-2, 720-3, and 720-4 may be connected to the SP8T switch 710 and the SP4T switch 730, and signals output from the SAW filters 720-2, 720-3, and 720-4 may be integrated through the SP4T switch 730 according to a predetermined format for the signal reception apparatus. The predetermined format may be determined under a control of the controller 217 or according to any suitable manner. That is, the SAW filters 720-5, 720-6, 720-7, and 720-8 may be connected to the SP8T switch 710 and the SP4T switch 740, and signals output from the SAW filters 720-5, 720-6, 720-7, and 720-8 may be integrated through the SP4T switch 740 in a predetermined format for the signal reception apparatus. The predetermined format is determined under a control of the controller 217. The predetermined format may be determined under a control of the controller 217 or according to any suitable manner. A signal output from the SAW filter 420-1 may be output as it is rather than being output through an SP4T switch.

The signal output from the SAW filter 720-1 may be output as an HB signal, a signal output from the SP4T switch 730 may be output as an MB signal, and a signal output from the SP4T switch 740 may be output as an LB signal. That is, the FEM 215 according to the exemplary embodiment FIG. 7 may include 3 output ports, i.e., an LB port, an MB port, and an HB port.

The SP4T switch 730 and the SP4T switch 740 may be used because the signals output from the SAW filters 720-2 to 720-8 are single signals. As described in FIG. 1, it will be understood by those of ordinary skill in the art that each of the SP4T switch 730 and the SP4T switch 740 may be a DPnT switch in a case where the signals output from the SAW filters 720-2 to 720-8 are balance signals. Thus, the FEM 215 may be a form in which the threshold frequency band attenuation requirement value and the threshold isolation requirement value are satisfied because an isolation characteristic is acquired in the front and the rear of SAW filters if the FEM 215 is implemented as described with respect to FIG. 7.

Figure 8:
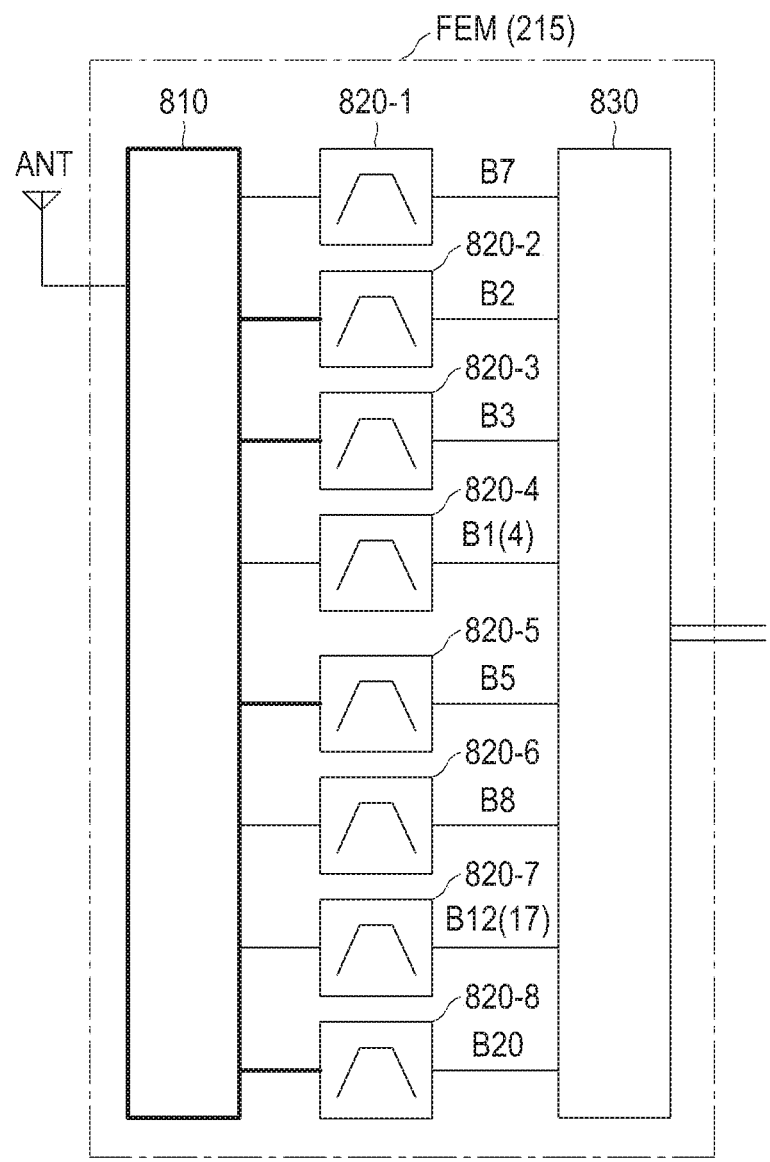
FIG. 8 illustrates still another example of an internal structure of an FEM, such as the FEM 215 shown in FIG. 2, according to an exemplary embodiment of the present invention.

FIG. 8 illustrates still another example of an internal structure of an FEM, such as the FEM 215 shown in FIG. 2, according to an exemplary embodiment of the present invention.

Referring to FIG. 8, the FEM 215 includes an SP8T switch 810, 8 SAW filters including SAW filters 820-1 to 820-8, and an SP8T switch 830. So, the number of output ports of the FEM 215 is 1. An index mapped to an output port of each SAW filter denotes a frequency band index of a frequency band used in a related SAW filter, and the detailed description of the frequency band index will be omitted.

The FEM 215 according to the exemplary embodiment FIG. 8 may be implemented as a type in which a SPnT switch is connected to the front and the rear of SAW filters in order to satisfy a threshold frequency band attenuation requirement value and a threshold isolation requirement value. That is, each of the SAW filters 820-1 to 820-8 may be connected to the SP8T switch 810 and the SP8T switch 830. Signals output from the SAW filters 820-1 to 820-8 may be integrated through the SP8T switch 830 in a predetermined format for the signal reception apparatus. The predetermined format may be determined under a control of the controller 217 or according to any suitable manner.

The SP8T switch 830 may be used because the signals output from the SAW filters 820-1 to 820-8 are single signals. As described with reference to FIG. 3, it will be understood by those of ordinary skill in the art that each of the SP8T switch 830 may be changed to a DPnT switch if the signals output from the SAW filters 820-1 to 820-8 are balance signals.

Figure 9:
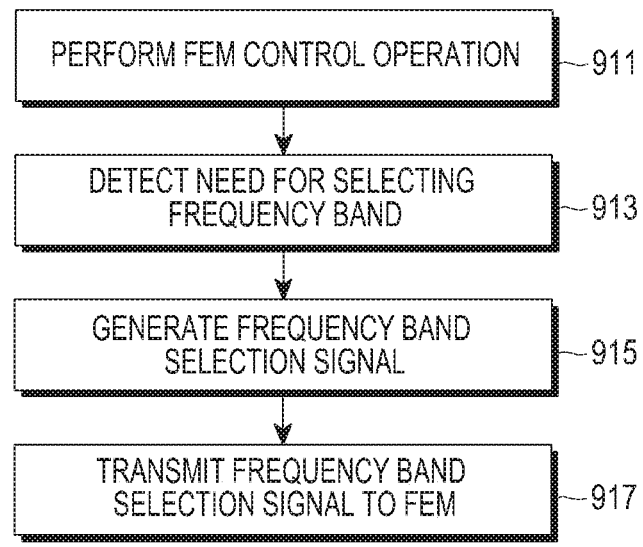
FIG. 9 is a flowchart illustrating an operation of a controller, such as the controller 217 shown in FIG. 2, according to an exemplary embodiment of the present invention.

FIG. 9 is a flowchart illustrating an operation of a controller, such as the controller 217 shown in FIG. 2, according to an exemplary embodiment of the present invention.

Referring to FIG. 9, a controller 217 initially controls an FEM 215 to integrate signals output from SAW filters included in the FEM 215 in operation 911, and detects a need for selecting a frequency band to be used in a signal reception apparatus in operation 913. There may be many cases in which the need for selecting the frequency band to be used in the signal reception apparatus is detected, for example, a case that a MODEM is initialized, a case that a specific mode is used in the MODEM, a case that multi-carriers are used, and any other similar and or suitable case, and the detailed description thereof will be omitted herein. The controller 217 generates a frequency band selection signal indicating a frequency band to be selected in operation 915 and transmits the frequency band selection signal to the FEM 215 in operation 917. After receiving the frequency band selection signal, the FEM 215 integrates signals output from SAW filters included in the FEM 215 based on the band selection signal and outputs the integrated signal.

Figure 10:
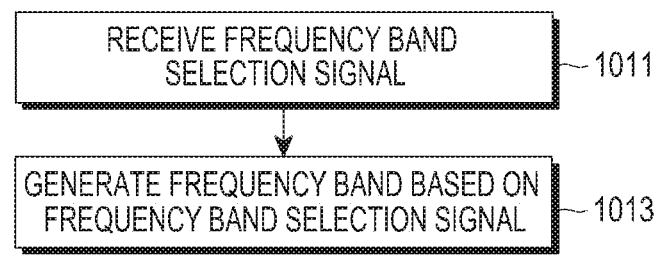
FIG. 10 is a flowchart illustrating an operation of an FEM, such as the FEM 215 shown in FIG. 2, according to an exemplary embodiment of the present invention.

FIG. 10 is a flowchart illustrating an operation of an FEM, such as the FEM 215 shown in FIG. 2, according to an exemplary embodiment of the present invention.

Referring to FIG. 10, an FEM 215 receives a frequency band selection signal from a controller 217 in operation 1011, and generates a frequency band based on the frequency band selection signal by controlling a connection among SAW filters, at least one switch and/or at least one combiner included in the FEM 215 in operation 1013. The operation of generating the frequency band the FEM 215 is performed in the manner described before with reference to FIGS. 3 to 8, so the detailed description will be omitted herein.

As is apparent from the foregoing description, exemplary embodiments of the present invention enable integrating signals output from SAW filters in an FEM in a signal reception apparatus. Exemplary embodiments of the present invention enable integrating signals output from SAW filters in an FEM in a signal reception apparatus in order to satisfy a threshold frequency band attenuation requirement value. Exemplary embodiments of the present invention enable integrating of the signals output from the SAW filters in the FEM in the signal reception apparatus in order to satisfy a threshold isolation requirement value.

Exemplary embodiments of the present invention enable integrating the signals output from the SAW filters in the FEM in the signal reception apparatus, thereby decreasing the unit cost of production without paths on which the SAW filters and an RFIC are connected in a one to one manner. Exemplary embodiments of the present invention enable integrating the signals output from the SAW filters in the FEM in the signal reception apparatus, thereby minimizing a hardware space in the signal reception apparatus without the paths on which the SAW filters and the RFIC are connected one to one.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A portable communication device comprising:
a radio frequency integrated circuit to support a plurality of frequency bands including a first specified frequency band, a second specified frequency band and a third specified frequency band;
a first switch adapted to receive a signal, the first switch to output the signal based at least in part on a selection of a corresponding specified frequency band of the first specified frequency band, the second specified frequency band and the third specified frequency band;
a plurality of filters coupled with the first switch and including a first filter corresponding to the first specified frequency band, a second filter corresponding to the second specified frequency band and a third filter corresponding to the third specified frequency band, each of the first filter, the second filter, and the third filter adapted to receive the signal from the first switch based at least in part on the selection of the corresponding specified frequency band;
a second switch including an input port coupled with the first filter and an output port coupled with the radio frequency integrated circuit, the second switch adapted to selectively pass the signal filtered via the first filter to the radio frequency integrated circuit; and
a third switch including a first input port coupled with the second filter, a second input port coupled with the third filter and an output port coupled with the radio frequency integrated circuit, the third switch adapted to selectively pass the signal filtered via a corresponding filter of the second filter and the third filter to the radio frequency integrated circuit,
wherein the output port of the second switch and the output port of the third switch output at least one signal based on at least one of a threshold frequency band attenuation requirement value or a threshold isolation requirement value, respectively.

2. The portable communication device of claim 1, wherein the first specified frequency band corresponds to a frequency band higher than the second and third specified frequency bands.

3. The portable communication device of claim 1, further comprising a controller adapted to perform the selection based at least in part on a determination that at least two carriers are used in relation with the receiving of the signal.

4. The portable communication device of claim 1, wherein the plurality of frequency bands includes a fourth specified frequency band and a fifth specified frequency band, and
wherein the plurality of filters include a fourth filter corresponding to the fourth specified frequency band and a fifth filter corresponding to the fifth specified frequency band.

5. The portable communication device of claim 4, further comprising:
a fourth switch coupled with the fourth and fifth filters; and
a combiner adapted to receive the signal and coupled with the first and the fourth switch such that the received signal is combined based at least in part on a frequency band of the signal.

6. A switching circuit comprising:
a first switch adapted to receive a signal, the first switch to output the signal based at least in part on a selection of a corresponding specified frequency band of a first specified frequency band, a second specified frequency band and a third specified frequency band;
a plurality of filters coupled with the first switch and including a first filter corresponding to the first specified frequency band, a second filter corresponding to the second specified frequency band and a third filter corresponding to the third specified frequency band, each of the first filter, the second filter, and the third filter adapted to receive the signal from the first switch based at least in part on the selection of the corresponding specified frequency band;
a second switch including an input port coupled with the first filter and an output port, the second switch adapted to selectively pass the signal filtered via the first filter; and
a third switch including a first input port coupled with the second filter, a second input port coupled with the third filter and an output port, the third switch adapted to selectively pass the signal filtered via a corresponding filter of the second filter and the third filter,
wherein the output port of the second switch and the output port of the third switch output at least one signal based on at least one of a threshold frequency band attenuation requirement value or a threshold isolation requirement value, respectively.

7. The switching circuit of claim 6, wherein the first specified frequency band corresponds to a frequency band higher than the second and third specified frequency bands.

8. The switching circuit of claim 6,
wherein the output port of the second switch is coupled with a radio frequency integrated circuit, and
wherein the output port of the third switch is coupled with the radio frequency integrated circuit.

9. The switching circuit of claim 6,
wherein the plurality of filters include a fourth filter corresponding to a fourth specified frequency band and a fifth filter corresponding to a fifth specified frequency band.

10. The switching circuit of claim 9, further comprising:
a fourth switch coupled with the fourth and fifth filters; and
a combiner adapted to receive the signal and coupled with the first and the fourth switch such that the received signal is combined based at least in part on a frequency band of the signal.

* * * * *